(12) United States Patent
Liu et al.

(10) Patent No.: US 9,941,892 B2
(45) Date of Patent: Apr. 10, 2018

(54) MULTI-STANDARD PERFORMANCE RECONFIGURABLE I/Q ORTHOGONAL CARRIER GENERATOR

(71) Applicant: Institute of Semiconductors, Chinese Academy of Sciences, Beijing (CN)

(72) Inventors: Xiaodong Liu, Beijing (CN); Nanjian Wu, Beijing (CN); Haiyong Wang, Beijing (CN); Wenfeng Lou, Beijing (CN); Jingjing Chen, Beijing (CN); Zhao Zhang, Beijing (CN)

(73) Assignee: Institute Of Semiconductors, Chinese Academy Of Sciences, Beijing (CN)

( * ) Notice: Subject to any disclaimer, the term of this patent is extended or adjusted under 35 U.S.C. 154(b) by 0 days.

(21) Appl. No.: 15/321,292

(22) PCT Filed: Jun. 24, 2014

(86) PCT No.: PCT/CN2014/080591
§ 371 (c)(1),
(2) Date: Dec. 22, 2016

(87) PCT Pub. No.: WO2015/196349
PCT Pub. Date: Dec. 30, 2015

(65) Prior Publication Data
US 2017/0163270 A1 Jun. 8, 2017

(51) Int. Cl.
*H03L 7/093* (2006.01)
*H03L 7/099* (2006.01)
(Continued)

(52) U.S. Cl.
CPC .............. *H03L 7/099* (2013.01); *H02M 3/07* (2013.01); *H03L 7/0898* (2013.01); *H03L 7/093* (2013.01);
(Continued)

(58) Field of Classification Search
CPC ....... H02M 3/00; H02M 3/07; H03L 2207/00; H03L 2207/06; H03L 7/00; H03L 7/0891;
(Continued)

(56) References Cited

U.S. PATENT DOCUMENTS 6,081,164 A * 6/2000 Shigemori ................ G06F 1/08
257/E23.059
7,847,646 B2 12/2010 Tsai et al.
(Continued)

FOREIGN PATENT DOCUMENTS

CN          101098142          1/2008
CN          101867545          10/2010
(Continued)

OTHER PUBLICATIONS

International Search Report for related International Patent Application No. PCT/CN2014/080591, dated Mar. 23, 2015.

*Primary Examiner* — Lincoln Donovan
*Assistant Examiner* — David Mattison
(74) *Attorney, Agent, or Firm* — McDermott Will & Emery LLP

(57) ABSTRACT

The present disclosure discloses a multi-standard performance reconfigurable I/Q orthogonal carrier generator. The generator may implement a continuously covered I/Q carrier output of 0.1-5 GHz and continuously covered differential signal outputs of 5-10 GHz and 1.5-3 GHz by means of reasonable frequency assignment; also, carrier signals under various frequencies with different loop bandwidths, different phase noises, different power consumption levels and different locking times can be generated by configuring a programmable charge pump (102), a loop filter (103) parameter, a multi-path voltage-controlled oscillator (104) and a first multiplexer (105) corresponding thereto, a five-stage-division-by-two frequency division link (109) and a corresponding second multiplexer (110) and third multiplexer
(Continued)

(112), so as to implement generation of a multi-standard performance reconfigurable I/Q orthogonal carrier.

10 Claims, 4 Drawing Sheets

(51) Int. Cl.
*H04B 1/40* (2015.01)
*H02M 3/07* (2006.01)
*H03L 7/089* (2006.01)
*H03L 7/193* (2006.01)

(52) U.S. Cl.
CPC ............ *H04B 1/40* (2013.01); *H03L 7/193* (2013.01); *H03L 2207/06* (2013.01)

(58) Field of Classification Search
CPC ... H03L 7/0893; H03L 7/0895; H03L 7/0896; H03L 7/0898; H03L 7/093; H03L 7/099; H03L 7/18; H03L 7/193; H04B 1/00; H04B 1/40

USPC ........................................................ 327/157
See application file for complete search history.

(56) References Cited

U.S. PATENT DOCUMENTS

| | | | |
|---|---|---|---|
| 9,647,829 B1* | 5/2017 | Hiebert | H04L 7/02 |
| 2010/0203848 A1* | 8/2010 | Darabi | H03L 7/0898 |
| | | | 455/86 |
| 2014/0306740 A1* | 10/2014 | Guyton | H03K 23/58 |
| | | | 327/115 |

FOREIGN PATENT DOCUMENTS

| | | |
|---|---|---|
| CN | 102122955 | 7/2011 |
| CN | 104079315 | 10/2014 |
| JP | 2005191626 | 7/2005 |

* cited by examiner

MULTI-STANDARD PERFORMANCE RECONFIGURABLE I/Q ORTHOGONAL CARRIER GENERATOR

CROSS-REFERENCE TO RELATED APPLICATIONS

This application is a U.S. National Stage Application of International Application No. PCT/CN2014/080591, filed Jun. 24, 2014, which is incorporated herein by reference in its entirety.

TECHNICAL FIELD

The present disclosure relates to the technical field of a RF (radio frequency) wireless transceiver in wireless communication applications, and particularly, to a multi-standard performance reconfigurable I/Q orthogonal carrier generator. The generator is based on a fractional frequency division structure, and can generate a continuously covered I/Q carrier output of 0.1-5 GHz and continuously covered differential signal outputs of 5-10 GHz and 1.5-3 GHz.

BACKGROUND

A frequency synthesizer is an important part of the wireless transceiver. The frequency synthesizer provides a local oscillation signal for the transceiver, performance of the frequency synthesizer directly determines performance level of the transceiver system, and power consumption of the frequency synthesizer often occupies a large proportion of overall power consumption of the transceiver. In recent years, with increasing development of wireless communication technology, more and more transceivers have developed to multi-mode and multi-standard, and many broadband and multi-band single-terminal transceiver chips which satisfy various kinds of communication standards are emerging. As a critical component of the transceiver, the frequency synthesizer in this kind of transceiver system needs to provide a very wide frequency range of local oscillation signal, and there are different locking times, phase noise performances etc. as required in different communication standards. If a plurality of frequency synthesizers are used for achieving the different locking times, phase noise performances etc., the system will often be complicated, and the cost will be difficult to control. In order to reduce the cost and improve integration level, it is desired that a single frequency synthesizer may satisfy requirements of various communication standards for the local oscillation signal; and also, if the performance (including the locking time, power consumption level, phase noise etc.) of the frequency synthesizer can implement reconstruction, the application of the frequency synthesizer will become more flexible.

SUMMARY

In view of this, a main object of the present disclosure is to provide a multi-standard performance reconfigurable I/Q orthogonal carrier generator, which may satisfy requirements of the transceiver for local oscillation of various standards below 5 GHz. A multi-path voltage controlled oscillator in the multi-standard performance reconfigurable I/Q orthogonal carrier generator needs to cover at least 5-10 GHz. As such, it is possible to generate 0.1-5 GHz orthogonal I/Q signal outputs via a division-by-two frequency division link.

For this purpose, the present disclosure provides a multi-standard performance reconfigurable I/Q orthogonal carrier generator, which comprises: a phase frequency detector, for comparing a frequency and a phase of an input reference signal with those of an output signal of a programmable multi-mode frequency divider; a programmable charge pump, which is controlled by an output signal of the phase frequency detector to generate a charging/discharging current, so as to charge/discharge a loop filter to change an output voltage of the loop filter; the loop filter, for converting the charging/discharging current from the programmable charge pump into an analog voltage for controlling a multi-path voltage controlled oscillator; the multi-path voltage controlled oscillator, which is controlled by the analog voltage for generating a locking frequency range of a phase locked loop as required; a first multiplexer, for selecting a path for an output signal of the multi-path voltage controlled oscillator, so as to decide which voltage controlled oscillator provides an oscillation frequency; a division-by-two frequency pre-divider, for performing a frequency pre-division-by-two operation on an output signal from the first multiplexer, so as to reduce a highest operation frequency of a programmable multi-mode frequency divider; the programmable multi-mode frequency divider, for controlling a frequency division ratio of a main loop of the phase locked loop, and finally deciding the locking frequency of the phase locked loop; a main loop output buffer, for outputting a signal of the main loop of the phase locked loop; a five-stage division-by-two frequency division link, for generating an I/Q signal of 0.1-5 GHz and outputting the I/Q signal in two paths respectively to a receiver and a transmitter; a second multiplexer and a third multiplexer, for selecting paths for output signals of the five-stage division-by-two frequency division link; an output buffer to receiver and an output buffer to transmitter, for outputting the two paths of the signals to the receiver and the transmitter respectively; and an input buffer, for receiving an external input signal into the five-stage division-by-two frequency division link.

According to the above technical solution, the present disclosure has beneficial effects as follows: 1) the multi-standard performance reconfigurable I/Q orthogonal carrier generator provided by the present disclosure is implemented by monolithic integration using a standard CMOS process, satisfying low cost requirement in actual applications; and the same chip provides I/Q local oscillation signals in all frequency bands covering 0.1-5 GHz. Also, various modules, such as the multi-path voltage controlled oscillator, the programmable charge pump, the loop filter, the first multiplexer, the second multiplexer, the third multiplexer, used in the present disclosure enable the power consumption level of the carrier generator, a locking period, a loop bandwidth and phase noise performance etc. of the phase locked loop to be reconstructed; 2) since the multi-standard performance reconfigurable I/Q orthogonal carrier generator provided by the present disclosure uses the programmable charge pump, the charging/discharging current thereof may be configured by programming, so that an automatic adjustment of the loop bandwidth may be implemented; 3) since the multi-standard performance reconfigurable I/Q orthogonal carrier generator provided by the present disclosure uses the multi-path voltage controlled oscillator in the phase locked loop, a whole tuning range of the voltage controlled oscillator covers 5-10 GHz and 1.5-3 GHz, and characteristics of respective independent voltage controlled oscillators consisting of the multi-path voltage controlled oscillator are different in e.g. frequency coverages, power consumption levels, phase noise performances and components etc.; 4)

the first multiplexer used in the multi-standard performance reconfigurable I/Q orthogonal carrier generator provided by the present disclosure is constituted by buffers designed for different operation frequency bands which are combined in parallel, so that not only load capability is enhanced contrapuntally, but also the loop power consumption levels of the phase locked loop applied on different frequency bands are reduced; 5) the multi-standard performance reconfigurable I/Q orthogonal carrier generator provided by the present disclosure uses the programmable multi-mode frequency divider for implementing frequency division ratio control in a large range, so that frequency locking of the main loop of the phase locked loop on 5-10 GHz and 1.5-3 GHz may be achieved, and different reference frequency configuration (10-50 GHz) requirements can also be satisfied; 6) the multi-standard performance reconfigurable I/Q orthogonal carrier generator provided by the present disclosure uses the output buffer of the main loop for outputting the local oscillation of the main loop of the phase locked loop. It should be noted that the output signal of the main loop is a differential signal, instead of an I/Q signal. The local oscillation signals output by the main loop are in 5-10 GHz and 1.5-3 GHz, which may provide signal source outputs for other chips; 7) the multi-standard performance reconfigurable I/Q orthogonal carrier generator provided by the present disclosure uses the five-stage division-by-two frequency division loop for generating the I/Q signal of 0.1-5 GHz, which is finally output to the receiver and the transmitter. The division-by-two frequency division can guarantee that the output I/Q signal has a good match property. Cascade if the five stages of division-by-two frequency dividers enables the output frequency below 0.1 GHz at the lowest. 8) the multi-standard performance reconfigurable I/Q orthogonal carrier generator provided by the present disclosure uses the second multiplexer and the third multiplexer for implementing selection of the path for the output signal of the five-stage division-by-two frequency division link, which is provided to the output buffer of the receiver and the output buffer of the transmitter respectively.

DETAILED DESCRIPTION

In order to clarify the objects, technical solutions and advantages of the present disclosure, the present disclosure will be described in detail in connection with particular embodiments with reference to the drawings.

The present disclosure provides a multi-standard performance reconfigurable I/Q orthogonal carrier generator, which is a kind of frequency synthesizer. Since a lot of wireless communication standards are concentrated within a frequency range below 5 GHz, such as Wireless Wide Area Network 2G-3G, Wireless Wide Area Network 4G, Metropolitan Area Network, Wireless Local Area Network, Wireless Body Area Network, Medical Communication, Digital Broadcast Digital TV etc., the present disclosure designs a frequency output range of the orthogonal carrier generator below 5 GHz. Also, the main loop provides an output port, which may provide a differential signal output of 5-10 GHz; and a frequency division output portion provides a port via which an external signal is input to the division-by-two frequency division link, thereby providing a platform for implementing MIMO between chips.

Figure 1:
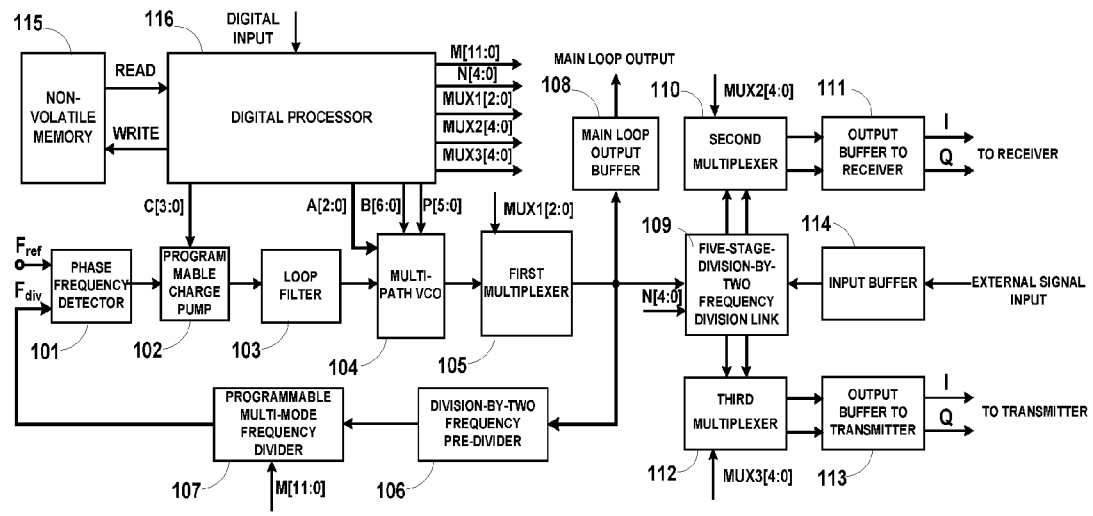
FIG. 1 is a system block diagram of a multi-standard performance reconfigurable I/Q orthogonal carrier generator according to the present disclosure.

FIG. 1 is a system block diagram of a multi-standard performance reconfigurable I/Q orthogonal carrier generator according to the present disclosure. The carrier generator comprises: a phase frequency detector 101, a programmable charge pump 102, a loop filter 103, a multi-path voltage controlled oscillator 104, a first multiplexer 105, a division-by-two frequency pre-divider 106, a programmable multi-mode frequency divider 107, a main loop output buffer 108, a five-stage division-by-two frequency division link 109, a second multiplexer 110, an output buffer 111 to receiver, a third multiplexer 112, an output buffer to transmitter, an input buffer 114, a non-volatile memory 115 and a digital processor 116.

The phase frequency detector 101 is used for comparing a frequency and a phase of an input reference signal with those of an output signal of the programmable multi-mode frequency divider 107. The phase frequency detector 101 generates a corresponding pulse voltage signal according to a frequency difference and a phase difference between the two input signals for driving the charge pump to charge/discharge the loop filter. One input end of the phase frequency detector 101 is connected to the external reference signal $F_{ref}$, the other input end of the phase frequency detector 101 is connected to an output signal $F_{div}$ of the programmable multi-mode frequency divider 107, and an output end of the phase frequency detector 101 is connected to an input end of the programmable charge pump 102. An output voltage pulse of the phase frequency detector 101 controls charging/discharging of the programmable charge pump 102.

The programmable charge pump 102 is controlled by the output signal of the phase frequency detector 101 to generate the charging/discharging current, so as to change a control voltage output by the loop filter. An input end of the programmable charge pump 102 is connected to the output end of the phase frequency detector 101, an output end of the programmable charge pump 102 is connected to an input end of the loop filter 103, and an operation state of the programmable charge pump 102 is controlled by an output C[3:0] of the digital processor 116. The programmable charge pump 102 is preferably a charging/discharging current configurable charge pump, which is controlled by a 4-bit digital signal in the present disclosure; and the amplitude of the current may be adjusted from a unit current I to 15I, so that the digital processor 116 may adjust a loop bandwidth of the phase locked loop.

The loop filter 103 is implemented by a low-pass filter for converting the charging/discharging current from the programmable charge pump 102 into an analog voltage for controlling the multi-path voltage controlled oscillator 104. An input end of the loop filter 103 is connected to the output end of the programmable charge pump 102, and an output end of the loop filter 103 is connected to an input end of the multi-path voltage controlled oscillator 104.

The multi-path voltage controlled oscillator 104 is used for generating oscillation signals of 5-10 GHz and 1.5-3 GHz as required, an oscillation frequency of which are collectively decided by digital signals A[2:0], B[6:0], P[5:0] and an output voltage of the loop filter 103. A[2:0] is used for selection of the voltage controlled oscillator, and has 3 control bits, each bit controlling an enabling end of a corresponding voltage controlled oscillator; and when one of the voltage controlled oscillators needs to be selected to operate, its corresponding control bit is configured as a high level, and all other control bits are configured as low levels. B[6:0] is used for selection of a sub-band, and has 7 control bits, each bit controlling a bit switch of a capacitor array in the corresponding voltage controlled oscillator; and an overall capacitance value of the capacitor array may be changed by switching on and off the bit switch, so as to change the oscillation frequency of the voltage controlled oscillator. P[5:0] is used for setting a preset signal of a mixed signal voltage controlled oscillator containing a frequency preset module. When A[2:0] selects the mixed signal voltage controlled oscillator to operate, the preset module generates a control voltage according to both a configuration of P[5:0] and the output voltage of the loop filter, which is then applied to a voltage controlled oscillator core, so as to generate the oscillation frequency as required. The input end of the multi-path voltage controlled oscillator 104 is connected to the output end of the loop filter 103, an output end of the multi-path voltage controlled oscillator 104 is connected to an input end of the first multiplexer 105, and an operation state of the multi-path voltage controlled oscillator 104 is controlled by the outputs A[2:0], B[6:0], P[5:0] of the digital processor 116. The multi-path voltage controlled oscillator 104 comprises three voltage controlled oscillators independent of each other, wherein a voltage controlled oscillator controlled by A[2] covers a frequency range of 5-10 GHz, which has very good phase noise performance; a voltage controlled oscillator controlled by A[1] covers a frequency range of 1.5-3 GHz, which has a very low power consumption; and a voltage controlled oscillator controlled by A[0] has a frequency preset function, so as to implement rapidly locking and considerably shorten a locking period. According to actual application requirements (such as power consumption requirement, frequency band requirement, locking period requirement, phase noise requirement etc.), the digital processor 116 selects one of the voltage controlled oscillators to operate, constituting the main loop of the phase locked loop, which may implement a frequency configuration of a broad frequency band in cooperation with the five-stage division-by-two frequency division link 109.

The first multiplexer 105 is used for selecting a path for the output signal of the multi-path voltage controlled oscillator 104, so as to decide which of the voltage controlled oscillators provides the oscillation frequency. The input end of the first multiplexer 105 is connected to the output end of the multi-path voltage controlled oscillator 104, an output end of the first multiplexer 105 is connected to output ends of the division-by-two frequency pre-divider 106, the five-stage division-by-two frequency division link 109 and the main loop output buffer 108 respectively, and an operation state of the first multiplexer 105 is controlled by an output MUX1[2:0] of the digital processor 116. The first multiplexer 105 is constituted by buffers designed for different operation frequency bands which are combined in parallel, each of the buffers being controlled by the output MUX1[2:0] of the digital processor 116 and being able to be switched on or off individually, no power being consumed by the buffer after the buffer is switched off.

The division-by-two frequency pre-divider 106 is used for performing a frequency pre-division-by-two operation on an output signal from the first multiplexer 105, so as to reduce a highest operation frequency of the programmable multi-mode frequency divider 107 and save power consumption. An input end of the division-by-two frequency pre-divider 106 is connected to the output end of the first multiplexer 105, and an output end of the division-by-two frequency pre-divider 106 is connected to an output end of the programmable multi-mode frequency divider 107.

The programmable multi-mode frequency divider 107 is used for controlling a frequency division ratio of the signal $F_{div}$ which is fed back to the phase locked loop to the phase frequency detector 101, and finally deciding the locking frequency of the phase locked loop. Since the frequency of the reference signal $F_{ref}$ is fixed, the frequency of $F_{div}$ will finally be consistent with that of $F_{ref}$. Changing configuration of the programmable multi-mode frequency divider 107 will change the frequency division ration thereof, and thus finally change the oscillation frequency of the voltage controlled oscillator, implementing the control on the locking frequency. An input end of the programmable multi-mode frequency divide 107 is connected to the output end of the division-by-two frequency pre-divider 106, the output end of the programmable multi-mode frequency divider 107 is connected to the input end of the phase frequency detector 101, and an operation state of the programmable multi-mode frequency divider 107 is controlled by an output M[11:0] of the digital processor 116. In the present disclosure, the frequency division ratio of the programmable multi-mode frequency divider 107 is controlled by a 12-bit digital signal, and the programmable multi-mode frequency divider 107 is constituted by 8 stages of ⅔ frequency division units and 4 frequency division ratio expanded logic units, a frequency division ratio range of which is 16-511, so as to satisfy operation requirements of the broadband phase locked loop.

The main loop output buffer 108 is used for outputting the signal of the main loop of the phase locked loop. An input end of the main loop output buffer 108 is connected to the output end of the first multiplexer 105, and an output end of the main loop output buffer 108 provides the local oscillation signal of the main loop of the phase locked loop for output out of chip.

The five-stage division-by-two frequency division link 109 is used for generating an I/Q signal of 0.1-5 GHz and outputting the I/Q signal in two paths respectively to the receiver and the transmitter. The input end of the five-stage division-by-two frequency division link 109 is connected to the output ends of the first multiplexer 105 and the input buffer 114 of the external signal, the output ends of the five-stage division-by-two frequency division link 109 are connected to output ends of the second multiplexer 110 and the third multiplexer 112 respectively, and an operation state of the five-stage division-by-two frequency division link 109 is controlled by an output N[4:0] of the digital processor 116. The five-stage division-by-two frequency division link 109 is constituted by five cascaded division-by-two frequency dividers, each stage of division-by-two frequency divider using current mode logic (CML) and being able to generate the output signal in I/Q form. Previous $N_1$ ($1 \leq N_1 \leq 5$) stages of division-by-two frequency dividers are controlled by a 5-bit digital signal to be switched on, so as to implement a frequency division output which is divided by 2 at least, by 32 at most.

The second multiplexer 110 and the third multiplexer 112 are used for selecting paths for output signals of the five-stage division-by-two frequency division link 109. The input end of the second multiplexer 110 is connected to the output end of the five-stage division-by-two frequency division link 109, the output end of the second multiplexer 110 is connected to the output buffer 111 to receiver, and an operation state of the second multiplexer 110 is controlled by an output MUX2[4:0] of the digital processor 116. The input end of the third multiplexer 112 is connected to the output end of the five-stage division-by-two frequency division link 109, the output end of the third multiplexer 112 is connected to the output buffer 113 to transmitter, and an operation state of the third multiplexer 112 is controlled by an output MUX3[4:0] of the digital processor 116. Each of the second multiplexer 110 and the third multiplexer 112 is constituted by five buffers designed for different operation frequency bands, the five buffers being respectively connected to output ends of respective stages of division-by-two frequency dividers in the five-stage division-by-two frequency division link 109, and one of the buffers being controlled by a 5-bit digital signal to be switched on and off. When the previous $N_1$ ($1 \leq N_1$) stages of division-by-two frequency dividers in the five-stage division-by-two frequency division link 109 are switched on, which means that the frequency synthesizer needs to select a frequency division result of the $N_1$-th stage of division-by-two frequency divider for outputting, the buffer in the second multiplexer 110 or the third multiplexer 112 which is connected to the $N_1$-th stage of division-by-two frequency divider will be switched on, while the remaining buffers will be switched off, so as to implement selection of the frequency as required.

The output buffer 111 to receiver and the output buffer 113 to transmitter are used for outputting the two paths of the signals to the receiver and the transmitter respectively. The input end of the output buffer 111 to receiver is connected to the output end of the second multiplexer 110, and the output end of the output buffer 111 to receiver provides the local oscillation signal for the receiver out of chip. The input end of the output buffer 113 to transmitter is connected to the output end of the third multiplexer 112, and the output end of the output buffer 113 to transmitter provide the local oscillation signal for the transmitter out of chip.

The input buffer 114 is used for receiving the external input signal into the five-stage division-by-two frequency division link 109. The input end of the input buffer 114 is connected to the external signal input, and the output end of the input buffer 114 is connected to the input end of the five-stage division-by-two frequency division link 109.

The main loop output buffer 108, the output buffer 110 to receiver and the output buffer 112 to transmitter may implement buffering of the output signal, enhance the load capability thereof, and enable isolation of in-chip signals from outside of the chip.

An input end of the non-volatile memory 115 is connected to an output of the digital processor 116, and an output end of the non-volatile memory 115 is connected to the input of the digital processor 116, READ and WRITE controlling a read-out process and a write-in process of the non-volatile memory 115 respectively.

The input end of the digital processor 116 receives externally input programming configuration data and data read from the non-volatile memory 115, and the output ends of the digital processors 116 are connected to the programmable charge pump 102, the multi-path voltage controlled oscillator 104, the first multiplexer 105, the programmable multi-mode frequency divider 107, the N-stage division-by-two frequency division link 109, the second multiplexer 110, the output buffer 111 to receiver, the third multiplexer 112, the output buffer 113 to transmitter and the input buffer 114, respectively. The digital processor 116 controls digit configuration of the whole multi-standard performance reconfigurable I/Q orthogonal carrier generator, and comprises a ΣΔ modulator module, a frequency sampling module, a frequency comparison module, and a linear interpolation calculation module.

Figure 2:
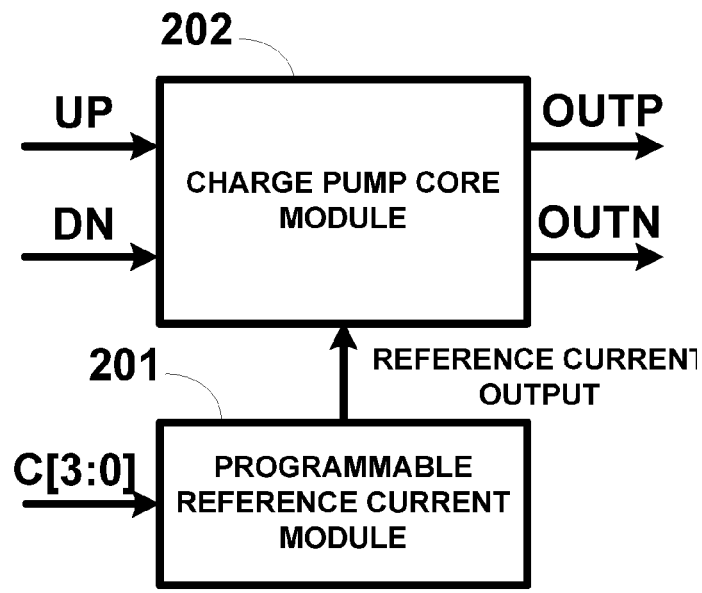
FIG. 2 is an exemplary circuit block diagram of a programmable charge pump in a multi-standard performance reconfigurable I/Q orthogonal carrier generator according to the present disclosure.

Based on the system block of the multi-standard performance reconfigurable I/Q orthogonal carrier generator as shown in FIG. 1, FIG. 2 shows an exemplary circuit block diagram of the programmable charge pump 102 according to the present disclosure. The charge pump is a current programmable full-differential charge pump, and constituted by a programmable reference current module 201 and a charge pump core module 202. Input signals UP and DN of the charge pump core module 202 are provided by the phase frequency detector 101, and output signals OUTP and OUTN of the charge pump core module 202 are provided to the loop filter 103. The programmable reference current module 201 is controlled by a 4-bit digital signal C[3:0] for implementing adjustment of the amplitude of the reference current from the unit current I to 15I. The charge pump core module 202 is controlled by the input signals UP and DN. When UP is high, the output signals OUTP and OUTN charge the loop filter 103 to increase the output voltage of the loop filter 103; and when DN is high, the output signals OUTP and OUTN discharge the loop filter 103 to decrease the output voltage of the loop filter 103. The amplitude of charging/discharging current is equal to that of the reference current provided by the programmable reference current module 201. The loop bandwidth of the phase locked loop may be adjusted by adjusting the amplitude of the charging/discharging current.

Figure 3:
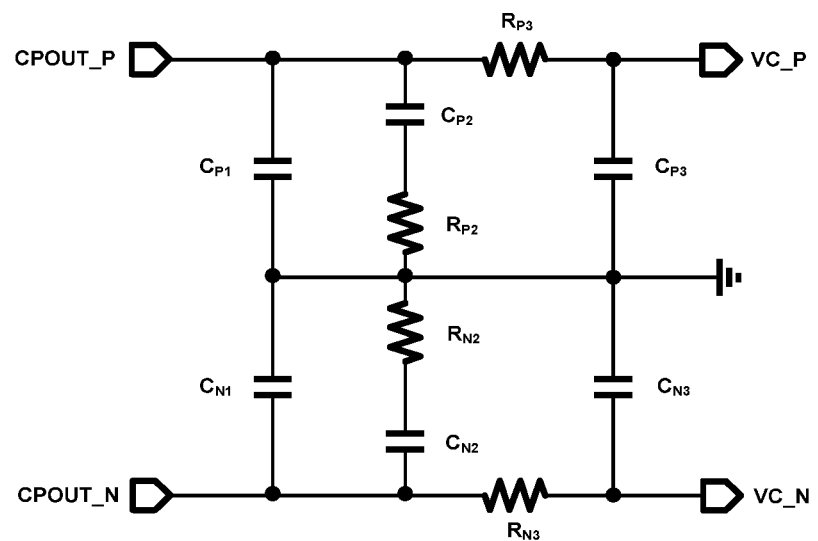
FIG. 3 is an exemplary circuit block diagram of a loop filter in a multi-standard performance reconfigurable I/Q orthogonal carrier generator according to the present disclosure.
Figure 4:
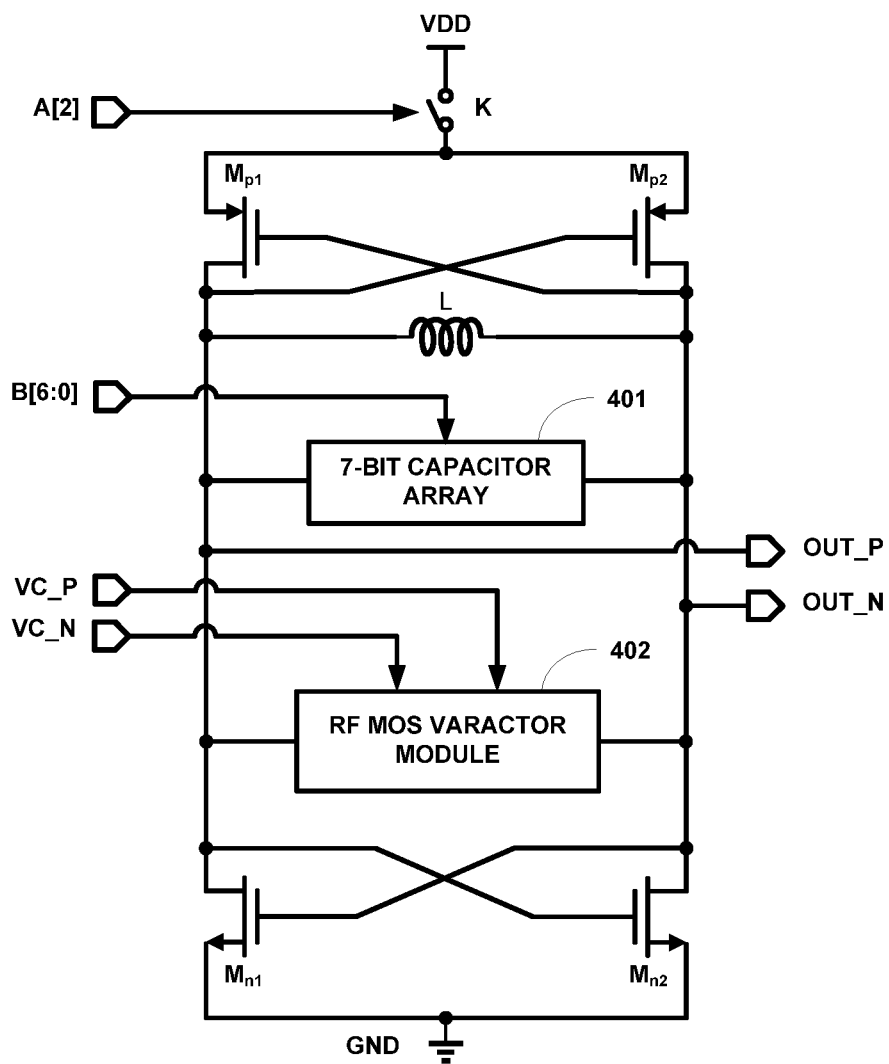
FIG. 4 is an exemplary circuit block diagram of one voltage controlled oscillator of a multi-path voltage controlled oscillator in a multi-standard performance reconfigurable I/Q orthogonal carrier generator according to the present disclosure.

Based on the system block of the multi-standard performance reconfigurable I/Q orthogonal carrier generator as shown in FIG. 1, FIG. 3 shows an exemplary circuit block diagram of the loop filter 103 according to the present disclosure. The loop filter is a differential input and differential output three-order low-pass filter, which may implement adjustment on loop characteristics such as loop bandwidth by adjusting device parameters. Input ends CPOUT_P and CPOUT_N are respectively provided by the outputs OUTP and OUTN of the programmable charge pump 102, and output ends VC_P and VC_N are provided to the multi-path voltage controlled oscillator 104 as control voltages. The loop filter 103 is constituted by resistors $R_{P2}$, $R_{P3}$, $R_{N2}$, $R_{N3}$ and capacitors $C_{P1}$, $C_{P2}$, $C_{P3}$, $C_{N1}$, $C_{N2}$, $C_{N3}$. Respective one ends of $C_{P1}$, $C_{P2}$, $C_{P3}$ are connected to CPOUT_P, while the other end of $C_{P1}$ is connected to GND, the other end of $C_{P2}$ is connected to one end of $R_{P2}$, the other end of $R_{P3}$ is connected to VC_P; one end of $R_{P2}$ is connected to $C_{P2}$, and the other end of $R_{P2}$ is connected to GND; and one end of $C_{P3}$ is connected to VC_P, and the other end of $C_{P3}$ is connected to GND. Respective one ends of $C_{N1}$, $C_{N2}$, $R_{N3}$ are connected to CPOUT_N, while the other end of $C_{N1}$ is connected to GND, the other end of $C_{N2}$ is connected to one end of $R_{N2}$, the other end of $R_{N3}$ is connected to VC_N; one end of $R_{N2}$ is connected to $C_{N2}$, and the other end of $R_{N2}$ is connected to GND; and one end of $C_{N3}$ is connected to VC_N, and the other end of $C_{N3}$ is connected to GND. Based on the system block of the multi-standard performance reconfigurable I/Q orthogonal carrier generator as shown in FIG. 1, FIG. 4 shows an exemplary circuit block diagram of one voltage controlled oscillator of the multi-path voltage controlled oscillator 104 according to the present disclosure. The voltage controlled oscillator uses a structure of NMOS and PMOS being complementary up and down and cross-coupling. The voltage controlled oscillator consists of PMOS cross-coupling paired tubes $M_{p1}$, $M_{p2}$, NMOS cross-coupling paired tubes $M_{n1}$, $M_{n2}$, a switch K, a inductor L, and 7-bit capacitor array 401 and a RF MOS varactor module 402. Sources of $M_{p1}$ and $M_{p2}$ are connected together, and are connected to one end of the switch K, and the other end of the switch K is connected to a power supply voltage VDD. K is controlled by the output A[2] from the digital processor 116. K is closed when the output A[2] is high, while K is disconnected when the output A[2] is low and thus the voltage controlled oscillator will not work. A drain of $M_{p1}$ is connected to a drain of $M_{n2}$, a gate of $M_{n2}$ and a gate of $M_{p2}$, while a gate of $M_{p1}$ is connected to a drain of $M_{p2}$, a drain of $M_{n2}$ and a gate of $M_{n1}$. Sources of $M_{n1}$ and $M_{n2}$ are connected together, and are connected to GND. One end of the inductor L is connected to the drain of $M_{p1}$, while the other end of the inductor L is connected to the drain of $M_{p2}$. An output end OUT_P of the oscillation signal is connected to the drain of $M_{p1}$, OUT_N is connected to the drain of $M_{p2}$, and the both are connected to the input end of the first multiplexer 105. One end of the 7-bit capacitor array 401 is connected to the drain of $M_{p1}$, and the other end of the 7-bit capacitor array 401 is connected to the drain of $M_{p2}$. The 7-bit capacitor array 401 is controlled by the output B[6:0] from the digital processor 116, each bit of B[6:0] controlling one capacitor in the 7-bit capacitor array 401 to be switched on and off. When one bit in B[6:0] becomes high from low, the corresponding capacitor is switched on, and the overall capacitance value of the capacitor array is increased, and the oscillation frequency of the voltage controlled oscillator is decreased; when one bit in B[6:0] becomes low from high, the corresponding capacitor is switched off, and the overall capacitance value of the capacitor array is decreased, and the oscillation frequency of the voltage controlled oscillator is increased. Thus, a coarse tuning on the oscillation frequency of the voltage controlled oscillator is formed. One end of the RF MOS varactor module 402 is connected to the drain of $M_{p1}$, and the other end of the RF MOS varactor module 402 is connected to the drain of $M_{p2}$. The capacitance value of the RF MOS varactor module 402 is controlled by the outputs VC_P and VC_N from the loop filter 103. Variations of the VC_P and VC_N cause capacitance value of the MOS varactor module 402 changes, so as to adjust the oscillation frequency of the voltage controlled oscillator, forming a fine tuning on the oscillation frequency of the voltage controlled oscillator. Since a tail current source tube and a bias circuit for providing the tube with bias belong to a big noise source, and 1/f noise of their tube will degrade the phase noise of the voltage controlled oscillator in a form of mixed frequency, no tail current form is selected; at the same time, this may increase the oscillation amplitude of the signal, facilitating to optimize the phase noise performance. The voltage controlled oscillator uses the 7-bit capacitor array for dividing the whole frequency band into 128 sub-bands, which reduces the gain of the voltage controlled oscillator, and expands the tuning scope of the voltage controlled oscillator; additionally, the varactor uses an accumulative MOS varactor, and the control voltage is input in a differential form, which expand the frequency coverage of each sub-band. The oscillation frequency range of the voltage controlled oscillator covers 5-10 GHz, characteristics of which are a high oscillation frequency, a large tuning range and good phase noise performance.

Figure 5:
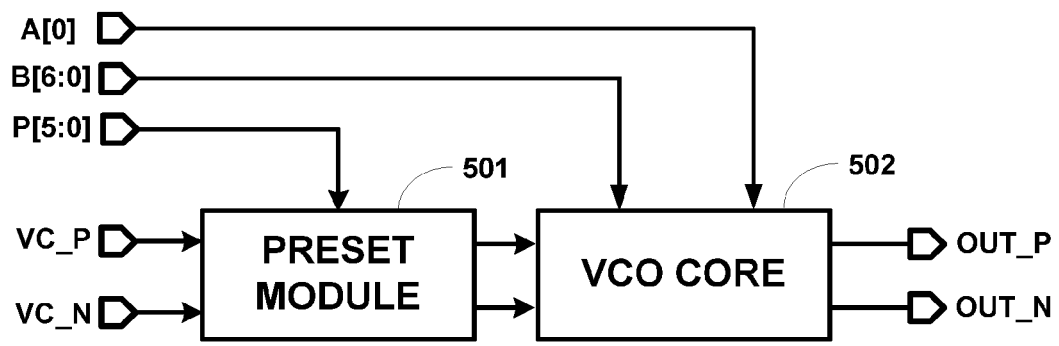
FIG. 5 is an exemplary circuit block diagram of a mixed signal voltage controlled oscillator in a multi-path voltage controlled oscillator in a multi-standard performance reconfigurable I/Q orthogonal carrier generator according to the present disclosure, which may implement a frequency preset function and thus implement rapid locking of a loop.

Based on the system block of the multi-standard performance reconfigurable I/Q orthogonal carrier generator as shown in FIG. 1, FIG. 5 shows an exemplary circuit block diagram of a mixed signal voltage controlled oscillator in the multi-path voltage controlled oscillator 104 according to the present disclosure, which may implement a frequency preset function and thus implement rapid locking of the loop. The mixed signal voltage controlled oscillator consists of a preset module 501 and a voltage controlled oscillator core 502. An input of the preset module 501 is connected to the output ends VC_P and VC_N of the loop filter 103, and an output end of the preset module 501 is connected to an input terminal of the voltage controlled oscillator core 502; and the preset module 501 is controlled by the output signal P[5:0] from the digital processor 116. An input end of the voltage controlled oscillator core 502 is connected to the output end of the preset module 501, and output ends OUT_P and OUT_N are connected to the input end of the first multiplexer 105; and the voltage controlled oscillator core 502 is controlled by the output signals A[0] and B[6:0] from the digital processor 116. The structure of the voltage controlled oscillator core 502 is identical with that of the voltage controlled oscillator as shown in FIG. 4. When A[0] is high, the voltage controlled oscillator core starts to work, and when A[0] is low, the voltage controlled oscillator core stops working. B[6:0] controls the operation state of the 7-bit capacitor array in the voltage controlled oscillator core. The control signals P[5:0] and B[6:0] from the digital processor 116 collectively decides the output frequency of the voltage controlled oscillator. When the multi-standard performance reconfigurable I/Q orthogonal carrier generator 104 selects the mixed signal voltage controlled oscillator in the multi-path voltage controlled oscillator 104 to operate, there are two operation modes, i.e., operation mode 1 and operation mode 2, in the system. In the operation mode 1, the preset module disconnects the input of the control voltage from the loop filter 103, and biases the input of the preset module to be a fixed level internally generated; sequentially records the output frequencies by adjusting the outputs P[5:0] and B[6:0] of the digital processor 116; and writes the output frequencies in the non-volatile memory 115. As such, the voltage controlled oscillator has a fixed frequency output corresponding to each of combinations of digits from P[5:0] and B[6:0]. This is a frequency sampling process, and actually a mapping relationship between P[5:0], B[6:0] and the output frequencies is obtained. The mapping relationship is stored in the non-volatile memory 115, so as to avoid increased workload and power consumption loss due to repetitive calibrations. In the operation mode 2, the input of the preset module is connected to the control voltage output from the loop filter 103. The digital processor 116 extracts the mapping relationship stored in the non-volatile memory; obtains the digit configurations P[5:0] and B[6:0] of the required frequency by the frequency comparison module and the linear interpolation calculation module; presets the output frequency of the mixed signal voltage controlled oscillator very close to the required frequency after P[5:0] and B[6:0] are set; and achieves final locking depending on the loop adjustment. When the frequency of the main loop needs to hop, the digital processor 116 adjusts P[5:0] and B[6:0] and the control signal M[11:0] of the programmable multi-mode frequency divider 107, so that the output frequency of the mixed signal voltage controlled oscillator is preset to another frequency point in a very short time. Since the control voltage varies little, the loop may be relocked in a very short time. The characteristics of the mixed signal voltage controlled oscillator is significantly reducing the loop locking period. However, since there is the preset module, the power consumption may be increased, and the phase noise performance may be reduced.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A multi-standard performance reconfigurable I/Q orthogonal carrier generator, comprising:
    a phase frequency detector for comparing a frequency and a phase of an input reference signal with a frequency and a phase of an output signal of a programmable multi-mode frequency divider;
    a programmable charge pump, which is controlled by an output signal of the phase frequency detector for generating a charging/discharging current, so as to charge/discharge a loop filter to change an output voltage of the loop filter;
    the loop filter for converting the charging/discharging current from the programmable charge pump into an analog voltage for controlling a multi-path voltage controlled oscillator;
    the multi-path voltage controlled oscillator, which is controlled by the analog voltage to generate a locking frequency range of a phase locked loop as required;
    a first multiplexer for selecting a path for an output signal of the multi-path voltage controlled oscillator, so as to decide which voltage controlled oscillator provides an oscillation frequency;
    a division-by-two frequency pre-divider, for performing a frequency pre-division-by-two operation on an output signal from the first multiplexer, so as to reduce a highest operation frequency of a programmable multi-mode frequency divider;
    the programmable multi-mode frequency divider for controlling a frequency division ratio of a main loop of the phase locked loop, and finally deciding the locking frequency of the phase locked loop;
    a main loop output buffer for outputting a signal of the main loop of the phase locked loop;
    a five-stage division-by-two frequency division link for generating an I/Q signal of 0.1-5 GHz and outputting the I/Q signal in two paths respectively to a receiver and a transmitter;
    a second multiplexer and a third multiplexer for selecting paths for output signals of the five-stage division-by-two frequency division link;
    an output buffer to receiver and an output buffer to transmitter, for outputting the two paths of the signals to the receiver and the transmitter respectively; and
    an input buffer for receiving an external input signal into the five-stage division-by-two frequency division link.

2. The multi-standard performance reconfigurable I/Q orthogonal carrier generator according to claim 1, wherein one input end of the phase frequency detector is connected to the external reference signal, and the other input end of the phase frequency detector is connected to an output signal of the programmable multi-mode frequency divider; and the phase frequency detector generates a corresponding pulse voltage signal according to a frequency difference and a phase difference between the two input signals for driving the charge pump to charge/discharge the loop filter.

3. The multi-standard performance reconfigurable I/Q orthogonal carrier generator according to claim 2, wherein the programmable charge pump is a charging/discharging current configurable charge pump, an input end of which is connected to an output end of the phase frequency detector, an output end of which is connected to an input end of the loop filter, and an operation state of which is controlled by a first output of a digital processor so as to adjust a loop bandwidth of the phase locked loop by the digital processor.

4. The multi-standard performance reconfigurable I/Q orthogonal carrier generator according to claim 3, wherein the multi-path voltage controlled oscillator generates oscillation signals of 5 GHz and 1.5-3 GHz as required, an oscillation frequency of which are collectively decided by digital signals A, B, P and an output voltage of the loop filter, A being used for selection of the voltage controlled oscillator, B being used for selection of a sub-band, P being used for setting a preset signal of a mixed signal voltage controlled oscillator containing a frequency preset module; and wherein when A selects the mixed signal voltage controlled oscillator to operate, the preset module generates a control voltage according to both a configuration of P and the output voltage of the loop filter, which is then applied to a voltage controlled oscillator core, so as to generate the oscillation frequency as required, wherein A, B and P are a second, a third and a fourth outputs of the digital processor, respectively.

5. The multi-standard performance reconfigurable I/Q orthogonal carrier generator according to claim 4, wherein the multi-path voltage controlled oscillator comprises three voltage controlled oscillators independent of each other, wherein a first voltage controlled oscillator covers a frequency range of 5-10 GHz, a second voltage controlled oscillator covers a frequency range of 1.5-3 GHz, and a third voltage controlled oscillator has a frequency preset function, so as to implement rapidly locking and shorten a locking period; and one of the voltage controlled oscillators is selected by the digital processor to operate, constituting the main loop of the phase locked loop.

6. The multi-standard performance reconfigurable I/Q orthogonal carrier generator according to claim 5, wherein an input end of the first multiplexer is connected to an output end of the multi-path voltage controlled oscillator, an output end of the first multiplexer is connected to output ends of the division-by-two frequency pre-divider, the five-stage division-by-two frequency division link and the main loop output buffer respectively, and an operation state of the first multiplexer is controlled by a fifth output of the digital processor; and the first multiplexer is constituted by buffers designed for different operation frequency bands which are combined in parallel, each of the buffers being controlled by the fifth output of the digital processor and being able to be switched on or off individually, no power being consumed by the buffer after the buffer is switched off.

7. The multi-standard performance reconfigurable I/Q orthogonal carrier generator according to claim 6, wherein an input end of the programmable multi-mode frequency divider is connected to the output end of the division-by-two frequency pre-divider, an output end of the programmable multi-mode frequency divider is connected to the input end of the phase frequency detector, and an operation state of the programmable multi-mode frequency divider is controlled by a sixth output of the digital processor.

8. The multi-standard performance reconfigurable I/Q orthogonal carrier generator according to claim 7, wherein the five-stage division-by-two frequency division link is used for generating the I/Q signal of 0.1-5 GHz and outputting in two paths respectively to the receiver and the transmitter, an input end of the five-stage division-by-two frequency division link is connected to the output ends of the first multiplexer and the input buffer of the external signal, output ends of the five-stage division-by-two frequency division link are connected to output ends of the second multiplexer and the third multiplexer respectively, and an operation state of the five-stage division-by-two frequency division link is controlled by a seventh output of the digital processor.

9. The multi-standard performance reconfigurable I/Q orthogonal carrier generator according to claim 8, wherein the five-stage division-by-two frequency division link is constituted by five cascaded division-by-two frequency dividers, each stage of division-by-two frequency divider using current mode logic and being able to generate the output signal in I/Q form; and previous $N_1$ ($1 \leq N_1 \leq 5$) stages of division-by-two frequency dividers are controlled by a 5-bit digital signal for switching on, so as to implement a frequency division output which is divided by 2 at least, by 32 at most.

10. The multi-standard performance reconfigurable I/Q orthogonal carrier generator according to claim 9, wherein each of the second multiplexer and the third multiplexer is constituted by five buffers designed for different operation frequency bands, the five buffers being respectively connected to output ends of respective stages of division-by-two frequency dividers in the five-stage division-by-two frequency division link, and one of the buffers being controlled by a 5-bit digital signal to be switched on and off; and when the previous $N_1$ ($1 \leq N_1$) stages of division-by-two frequency dividers in the five-stage division-by-two frequency division link are switched on, which means that a frequency synthesizer needs to select a frequency division result of the $N_1$-th stage of division-by-two frequency divider for outputting, the buffer in the second multiplexer or the third multiplexer which is connected to the $N_1$-th stage of division-by-two frequency divider will be switched on, while the remaining buffers will be switched off, so as to implement selection of the frequency as required.

* * * * *